United States Patent
Huemoeller et al.

(10) Patent No.: US 6,660,559 B1
(45) Date of Patent: Dec. 9, 2003

(54) METHOD OF MAKING A CHIP CARRIER PACKAGE USING LASER ABLATION

(75) Inventors: Ronald P. Huemoeller, Chandler, AZ (US); Richard P. Sheridan, Gilbert, AZ (US)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/888,950

(22) Filed: Jun. 25, 2001

(51) Int. Cl.$^7$ .............................................. H01L 21/44
(52) U.S. Cl. ........................ 438/106; 438/109; 438/113; 438/124; 438/126
(58) Field of Search .................................. 438/106, 109, 438/113, 124, 126, 22, 118, 462, 597, 598, 612, 613, 678, 125, 162–167

(56) References Cited

U.S. PATENT DOCUMENTS

| | | |
|---|---|---|
| 5,328,870 A | 7/1994 | Marrs |
| 5,355,283 A | 10/1994 | Marrs et al. |
| 5,364,736 A | 11/1994 | Eramo, Jr. et al. |
| 5,378,869 A | 1/1995 | Marrs et al. |
| 5,455,462 A | 10/1995 | Marrs |
| 5,478,007 A | 12/1995 | Marrs |
| 5,483,100 A | 1/1996 | Marrs et al. |
| 5,486,657 A * | 1/1996 | Bell et al. .................... 174/261 |
| 5,583,378 A | 12/1996 | Marrs et al. |
| 5,635,671 A | 6/1997 | Freyman et al. |
| 5,641,987 A | 6/1997 | Lee |
| 5,701,034 A | 12/1997 | Marrs |
| 5,722,161 A | 3/1998 | Marrs |
| 5,829,988 A | 11/1998 | McMillan et al. |
| 5,852,870 A | 12/1998 | Freyman et al. |
| 5,854,511 A | 12/1998 | Shin et al. |
| 5,864,470 A | 1/1999 | Shim et al. |
| 5,915,169 A | 6/1999 | Heo |
| 5,981,314 A | 11/1999 | Glenn et al. |
| 5,987,744 A | 11/1999 | Lan et al. |
| 6,150,193 A | 11/2000 | Glenn |
| 6,214,644 B1 | 4/2001 | Glenn |
| 6,222,156 B1 * | 4/2001 | Datta .................... 219/121.68 |
| 6,228,676 B1 | 5/2001 | Glenn et al. |
| 6,258,629 B1 | 7/2001 | Niones et al. |
| 6,266,197 B1 | 7/2001 | Glenn et al. |
| 6,309,943 B1 | 10/2001 | Glenn et al. |
| 6,326,244 B1 | 12/2001 | Brooks et al. |
| 6,329,606 B1 | 12/2001 | Freyman et al. |
| 6,331,451 B1 | 12/2001 | Fusaro et al. |
| 6,338,985 B1 | 1/2002 | Greenwood |

(List continued on next page.)

OTHER PUBLICATIONS

IBM TDB, Nov. 1993, vol. 36, issue 11, p. 589.*
Ronald P. Huemoeller & Sukianto Rusli "Semiconductor Package Having Substrate With Laser–Formed Aperture Through Solder Mask Layer" U.S. application No.: 09/932,528 filed on Aug. 17, 2001 and Notice of Allowance for Same.
IBM TDB, Novl. 1993, vol. 36, issue 11, p. 589.

*Primary Examiner*—Matthew Smith
*Assistant Examiner*—Igwe U. Anya
(74) *Attorney, Agent, or Firm*—Bever, Hoffman & Harms, LLP; James E. Parsons

(57) ABSTRACT

A chip carrier package is made by using a laser-ablatable solder mask to cover areas of conductive traces on the surface of a substrate that were left uncovered during conventional processes using photoresist. These areas of the conductive traces are uncovered by using a laser to remove overlying portions of the solder mask. If a YAG laser is used, the conductive traces are removed at the same time the solder mask ablated. However, is a $CO_2$ laser is used, a conventional etching process removes the exposed portions of the traces after the solder mask is ablated.

16 Claims, 5 Drawing Sheets

U.S. PATENT DOCUMENTS

| | | |
|---|---|---|
| 6,339,252 B1 | 1/2002 | Niones et al. |
| 6,342,406 B1 | 1/2002 | Glenn et al. |
| 6,356,453 B1 | 3/2002 | Juskey et al. |
| 6,369,454 B1 | 4/2002 | Chung |
| 6,389,687 B1 | 5/2002 | Glenn et al. |
| 6,389,689 B2 | 5/2002 | Heo |
| 6,396,043 B1 | 5/2002 | Glenn et al. |
| 6,399,418 B1 | 6/2002 | Glenn et al. |
| 6,399,463 B1 | 6/2002 | Glenn et al. |
| 6,406,934 B1 | 6/2002 | Glenn et al. |
| 6,407,381 B1 | 6/2002 | Glenn et al. |
| 6,407,458 B1 | 6/2002 | Huemoeller |
| 6,417,576 B1 | 7/2002 | Ellenberger et al. |
| 6,420,201 B1 | 7/2002 | Webster |
| 6,420,776 B1 | 7/2002 | Glenn et al. |
| 6,424,315 B1 | 7/2002 | Glenn et al. |
| 6,428,641 B1 | 8/2002 | Yoon et al. |
| 6,432,737 B1 | 8/2002 | Webster |
| 6,441,503 B1 | 8/2002 | Webster |
| 6,441,504 B1 | 8/2002 | Glenn et al. |
| 6,444,499 B1 | 9/2002 | Swiss et al. |
| 6,448,506 B1 | 9/2002 | Glenn et al. |
| 6,448,633 B1 | 9/2002 | Yee et al. |
| 6,455,774 B1 | 9/2002 | Webster |
| 6,455,927 B1 | 9/2002 | Glenn et al. |
| 6,459,147 B1 | 10/2002 | Crowley et al. |
| 6,465,329 B1 | 10/2002 | Glenn |
| 6,476,331 B1 | 11/2002 | Kim et al. |
| 6,476,476 B1 | 11/2002 | Glenn |
| 6,534,391 B1 | 3/2003 | Huemoeller et al. |

* cited by examiner

US 6,660,559 B1

METHOD OF MAKING A CHIP CARRIER PACKAGE USING LASER ABLATION

FIELD OF THE INVENTION

The present invention relates to the manufacture of chip carrier packages, and in particular forming desired patterns on the packages.

BACKGROUND OF THE INVENTION

Certain types of conventional semiconductor packages or chip carrier packages (CCPs), such as ball grid array (BGA) packages, include an internal substrate. The substrate includes a core insulative sheet between layers of patterned metal. The patterned metal layer on a top surface of the insulative sheet includes a central rectangular die pad and a plurality of metal traces radiating from the die pad. Each of the traces includes a bond finger adjacent to the die pad. The patterned metal layer on an opposite bottom surface of the insulative sheet includes a plurality of metal traces each terminating at a ball land. The bond fingers and ball lands are typically plated with layers of nickel (Ni) and gold (Au). Metal-lined vias extend vertically through the substrate and electrically connect the metal traces on the top and bottom surfaces of the sheet.

A layer of an epoxy solder mask material is applied over the top and bottom metal layers. The bond fingers, ball lands, and die pad are exposed through openings in the solder mask. A semiconductor die is attached to the metal die pad on the top surface of the sheet. A plurality of bond wires each electrically connect a bond pad of the die to one of the bond fingers of the metal traces on the top surface of the sheet. A hardened molded encapsulant covers the die and bond wires and the entire top surface of the substrate. Solder balls are fused to the ball lands of the metal traces on the bottom surface of the sheet. The solder balls, therefore, are electrically connected to the die through the metal traces, vias, and bond wires.

Metal traces on the top and bottom surface of the substrate are typically formed with a solder mask. FIGS. 1–5 are top plan views of a typical process for removing metal connections. FIG. 1 shows a portion of metal leads or bond fingers 10 on a top surface of a substrate for the CCP. Bond fingers 10, e.g., formed from copper, nickel and gold, are electrically connected by a tie-bar 12, e.g., also formed from copper. A photo-imagable solder mask 14 is positioned over the designed-in shorts 15 and tie-bar 12 such that portions 16 of the designed-in shorts 15 to be subsequently removed remain exposed. Next, in FIG. 2, a photoresist 18 is selectively deposited over designed-in shorts 15 and solder mask 14 such that desired portions of the patterned metal, which include bond fingers 10 to be nickel and gold plated, remain exposed. The photoresist is chosen to be compatible with nickel-gold baths.

In FIG. 3, the exposed portions of copper bond fingers 10 and designed-in shorts 15 are plated with a nickel (Ni)/gold (Au) plating to allow for subsequent wire bonding operations. Because portions 16 are covered by photoresist 18, these portions are not Ni/Au plated. After Ni/Au plating, the photoresist is removed to expose copper portions 16, as shown in FIG. 4. A standard copper etch removal process then etches these portions 16 of designed-in shorts 15, as shown in FIG. 5. Wire bonding, lands, and other types of connections can then be made between a die or chip and the top and/or bottom surfaces of the CCP without subsequent electrical shorting taking place.

This type of conventional process requires the application and removal of photoresist, which increases both costs and time. Photoresist also has limited resolution capabilities, requiring increased tolerance for registration and, as a result of the etch-back process, longer permanent stub remnants remain in the CCP. Accordingly, it is desirable to have a process in which the use of photoresist is not required.

SUMMARY OF THE INVENTION

According to an aspect of the present invention, a laser-ablatable solder mask is formed over portions of metal traces, including areas that are to be removed. The solder mask then protects these areas from a subsequent Ni/Au plating, thereby eliminating the need for a photoresist layer. A laser then selectively ablates portions of the solder mask to expose areas of the traces to be removed. A conventional copper etch removal process subsequently etches away these selected areas. In other embodiments, a YAG laser is used, which can remove both portions of the solder mask and the underlying portions of traces.

In one embodiment, metal traces are first patterned on a top and/or bottom surface of a chip carrier package (CCP) substrate. A laser-ablatable solder mask is formed over the traces to expose portions that are to be used for later chip connection. A laser, such as a $CO_2$ or YAG laser, ablates portions of the solder mask to expose designed-in shorts of the traces selected for removal. These exposed areas are removed with a standard etch back process or, if a YAG laser is used, these areas are removed by the YAG laser at the same time the portions of the solder mask are removed.

The present invention eliminates the need for depositing and removing photoresist, which decreases the cost and time to manufacture a CCP as compared with conventional methods. Furthermore, the registrational difference afforded through the use of laser ablation is significantly better than that attainable with photoimaging in conventional processes. This is due to the requirement of an additional photoresist operation. For example, a typical registrational tolerance for photoresist lithography is 75 $\mu$m, while a typical registrational tolerance for laser ablation is 25 $\mu$m.

In addition, photolithography and etch-back processes typically leave a copper stub (e.g., on the order of 50 $\mu$m), resulting from the registrational tolerance differences. These stubs will impact the signal loss/antenna effect. Thus, an additional benefit of the present invention is that the tie bar lengths are reduced, which allows this type of CCP to be used in high speed digital and RF applications.

The present invention will be more fully understood when taken in light of the following detailed description taken together with the accompanying drawings.

BRIEF DESCRIPTION OF THE DRAWINGS

Use of the same or similar reference numbers in different figures indicates same or like elements.

DESCRIPTION OF THE PREFERRED EMBODIMENTS

According to the present invention, a laser is used to ablate portions of a solder mask to expose desired areas of underlying traces. These areas are moved, either by the laser or by chemical etching, during the process flow for making a chip carrier package (CCP).

Figure 1:
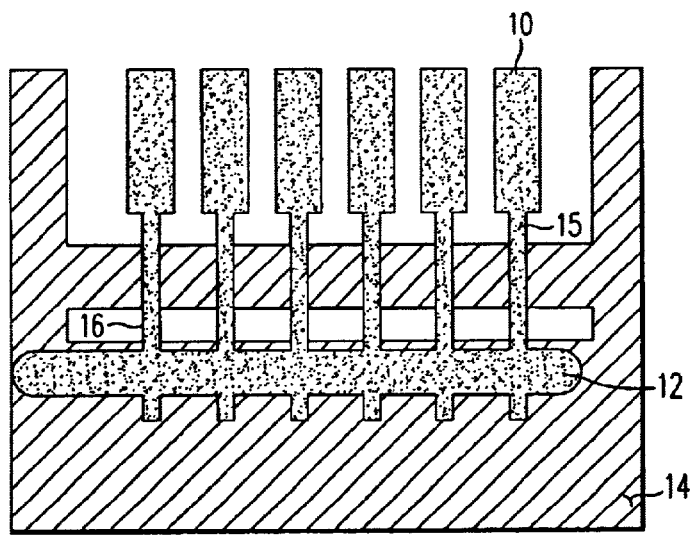
FIGS. 1–5 are top views of a conventional process for removing shorts during manufacture of a chip carrier package (CCP).
Figure 2:
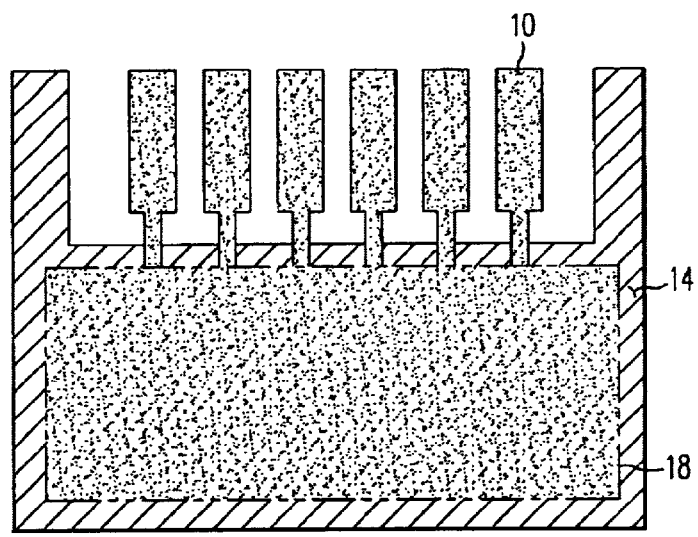
Figure 3:
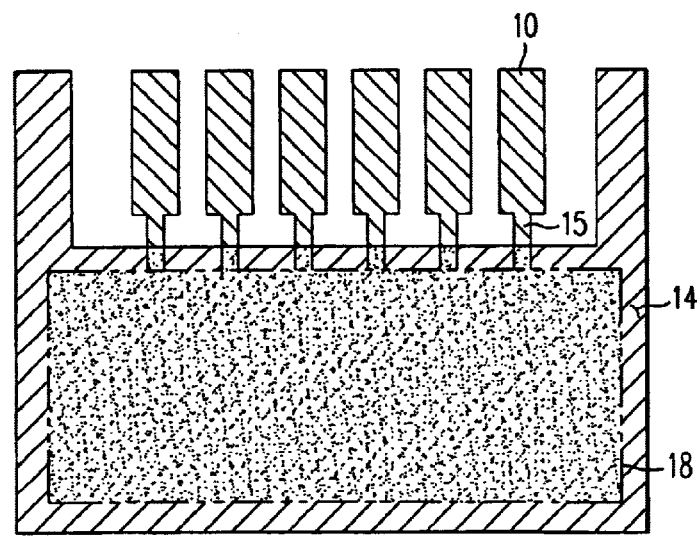
Figure 4:
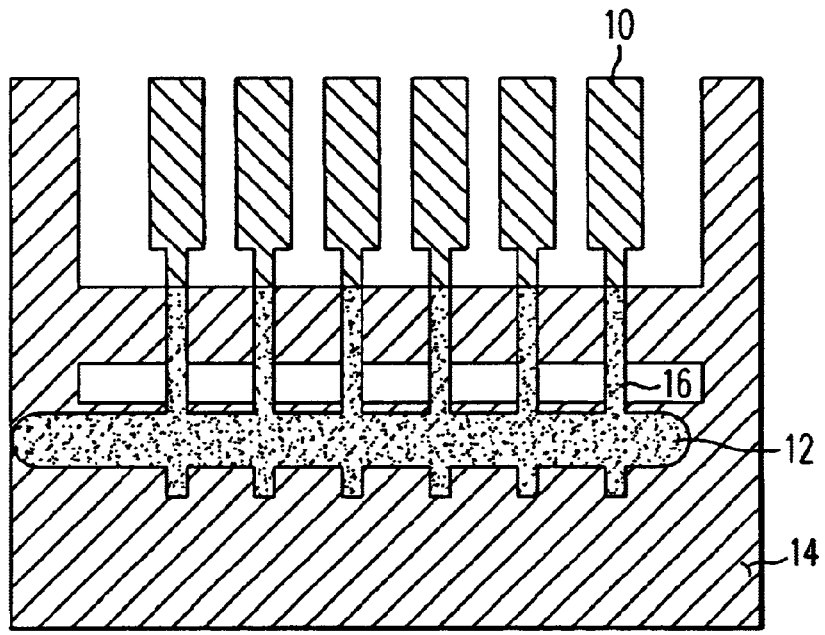
Figure 5:
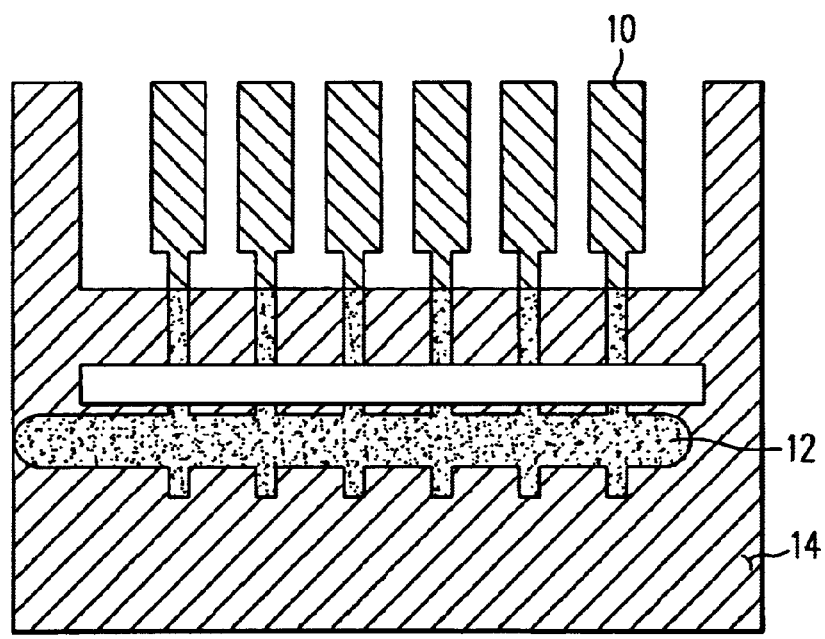
Figure 6:
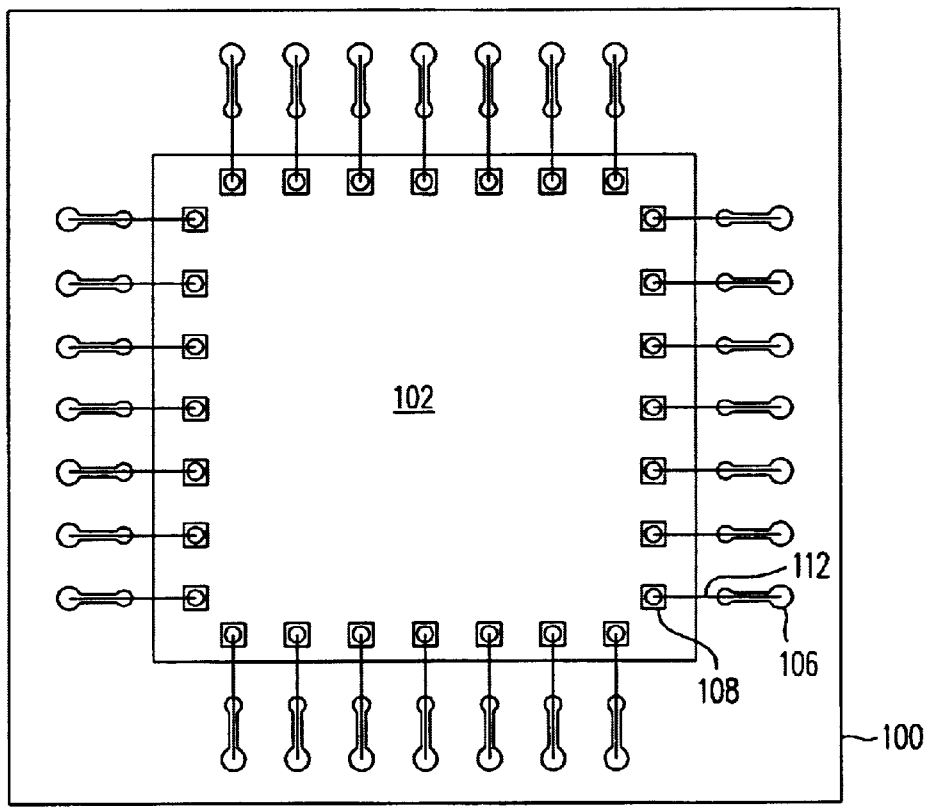
FIG. 6 is a top view of a CCP and chip according to one embodiment of the invention.
Figure 7:
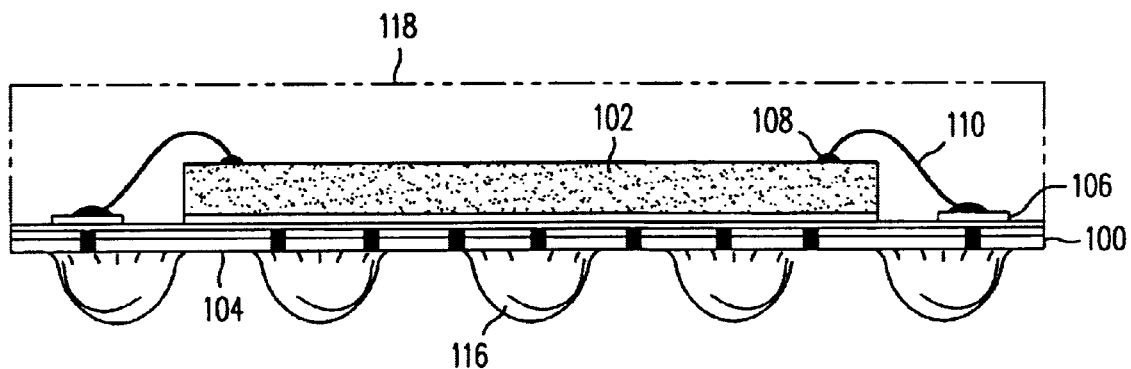
FIG. 7 is a side view of the CCP and chip of FIG. 6.

FIGS. 6 and 7 are a top and side views, respectively, of a CCP 100 with a semiconductor die or chip 102 attached to the upper surface, such as with a layer 104 of solder or filled epoxy. Die pads 106 on chip 102 are electrically connected to corresponding pads 108 on CCP 100 by fine, conductive wires 110 having opposite ends respectively bonded to corresponding ones of the pads on the die and the CCP. Electrical signals are conducted from pads 108 through wires 110 to pads 106 on CCP 100, and thence, through the CCP by "vias," i.e., plated-through apertures in the CCP, to lands on the lower surface of the CCP 100. Solder balls 116 are welded on the lands to serve as input/output terminals or heat conducting terminals for the package. A monolithic body 118 of an insulative material, e.g., an epoxy resin, is formed over die 102 and the upper surface of the CCP 100 to seal the die and protect it from the environment.

In order to provide connections to both chip 102 and solder balls 116, CCP 100 has on its top and bottom surfaces, respectively, patterned metal layers. The metal layers, typically copper, are electrically connected to each other through conductive vias. There are many suitable ways to form this substrate, one of which is disclosed in commonly-owned U.S. pat. appl. Ser. No. 09/505,395, entitled "Printed Circuit Board With Heat Spreader And Method Of Making", filed Feb. 16, 2000, which is incorporated by reference in its entirety.

Figure 8:
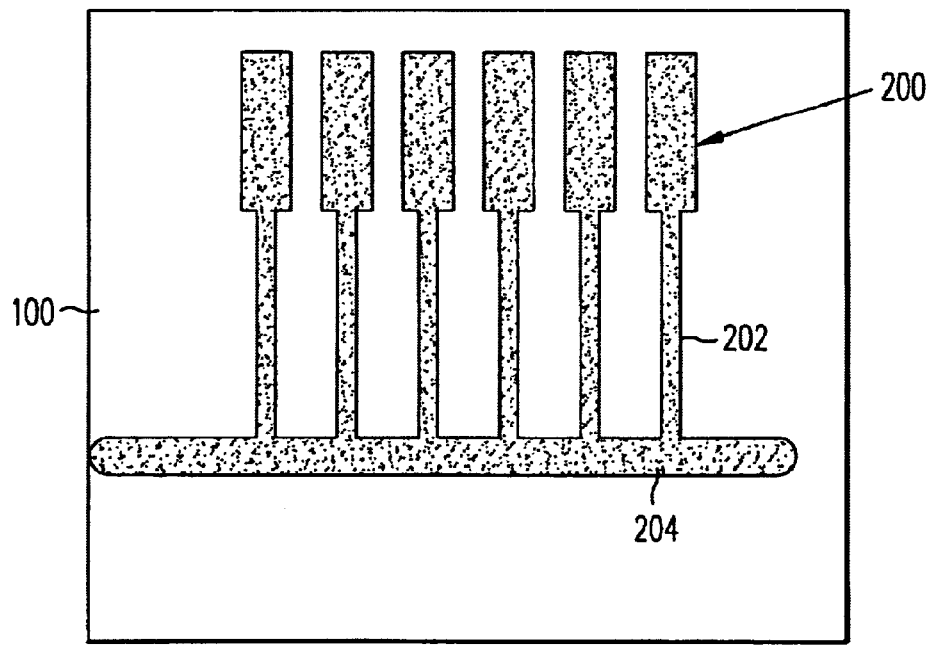
FIGS. 8–12 are top views of a process for removing shorts during manufacture of a CCP according to one aspect of the present invention.
Figure 9:
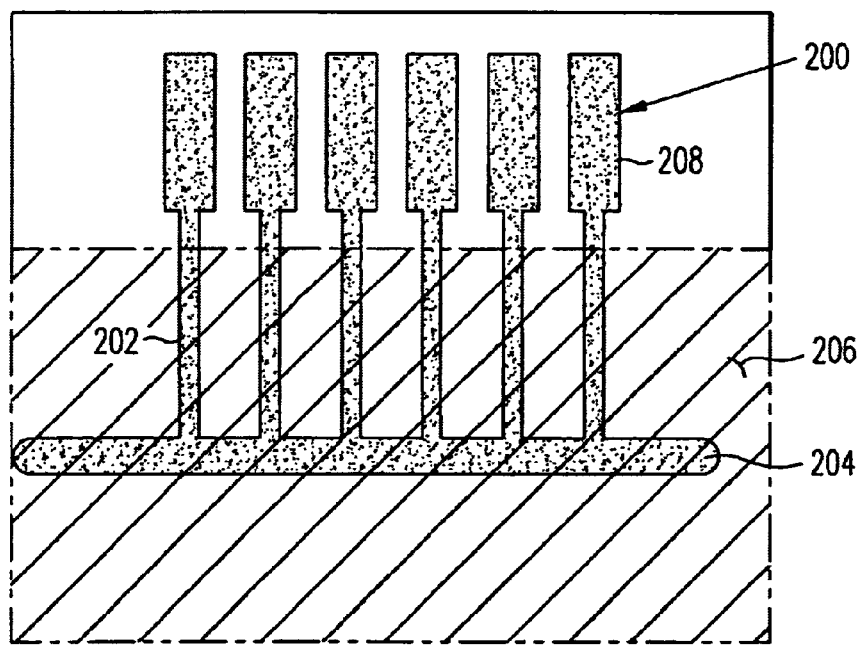
Figure 10:
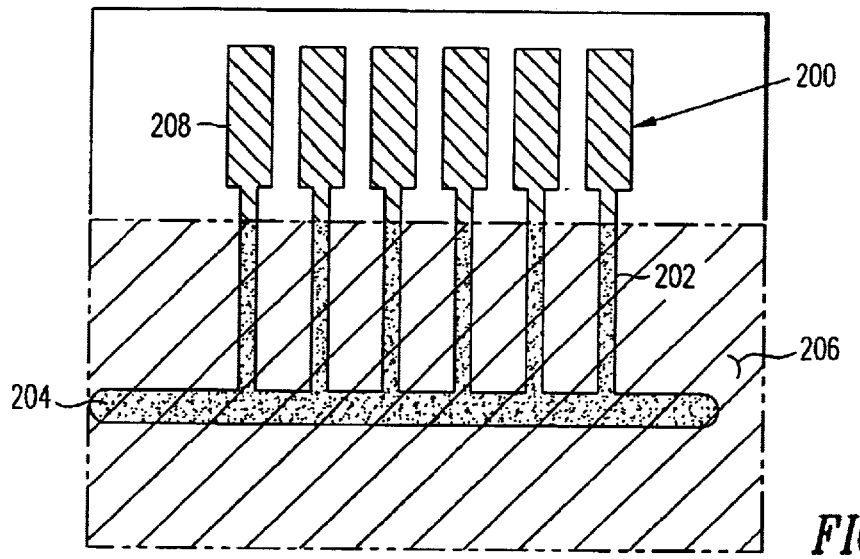

FIG. 8 is a top view of a portion of the top surface of CCP 100. Bond fingers 200, e.g., formed from copper, nickel and gold, are patterned with designed-in shorts 202 and a tie-bar 204. In FIG. 9, a laser-ablatable solder mask 206 is formed over selected areas of shorts 202. Solder mask 206 has properties that allow it to be ablated by the type of laser used later. Typically, solder mask 206 is made of an epoxy-based material or pure epoxy and is a thermal or photoimageable mask. For example, solder mask 206 covers tie-bar 204 and shorts 202, even in portions of shorts 202 that will be removed. This is in contrast to conventional processes, in which the solder mask has a "window" that leaves exposed portions of the shorts to be later removed. Solder mask 206 leaves unexposed portions 208 of patterned features that will be nickel/gold plated for electrical connection to the chip or eternal conductors, such as wire bonds. Next, portions 208 of bond fingers 200 left exposed by solder mask 206 are plated to increase conductivity, such as with a nickel (Ni)/gold (Au) plating.

Figure 11:
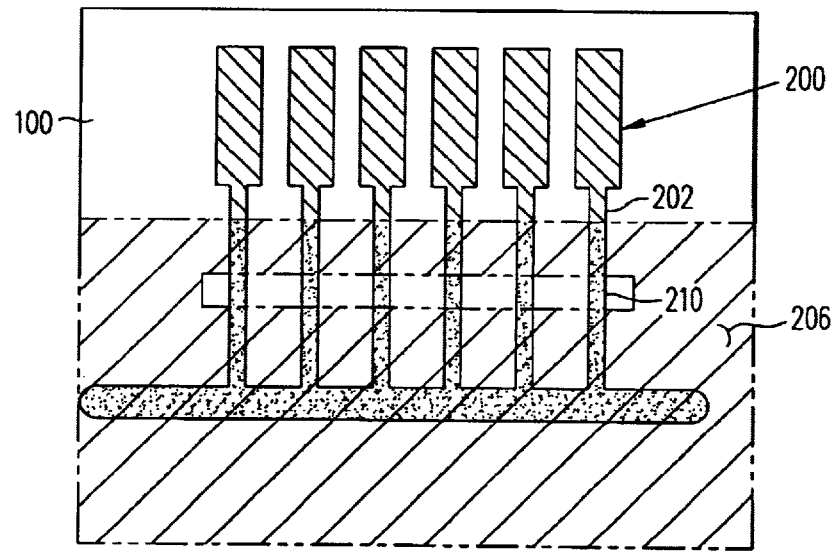
Figure 12:
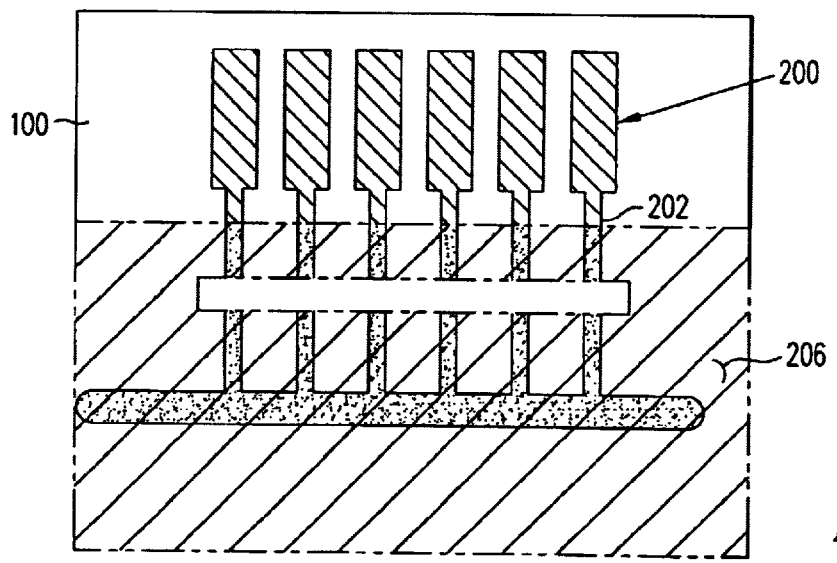

FIG. 11 shows CCP 100 after a laser has removed portions of solder mask 206 overlying areas 210 of shorts 202 that are to be removed. As seen in FIG. 11, areas 210 of shorts 202 are now exposed. The laser, such as a $CO_2$ laser, does not remove these portions of shorts 202. A conventional etch back process, such as a chemical etching, removes these areas, resulting in the desired disconnects within individual bond fingers 200, as shown in FIG. 12. In other embodiments, a UV-YAG laser is used to ablate solder mask 206. Since a YAG laser has much higher energy and operates in a different wavelength range than a $CO_2$ laser, a more careful control and operation of the laser will be needed. As is known by those skilled in the art, the power, number, and frequency of the pulses of a YAG laser can be controlled to selectively remove areas 210 of shorts 202 at the same time solder mask 206 is ablated.

The present invention provides a method of making a high density laminate chip carrier substrate using a photo-imageable solder mask and laser ablation technology for use in a ball grid array (BGA) or land grid array (LGA) type of semiconductor package that uses only conventional fabrication methods and materials. Laser ablation eliminates the need for depositing and removing photoresist, although photoresist can still be used with this invention. Benefits from making a CCP according to the present invention include reduced electrical antenna effect, lower cost per CCP as a result of less material required to perform the operation and higher throughput, and higher density as more etch-back opportunities exist through design as a result of the smaller area required (e.g., 25 $\mu$m) to create the etch-back in the shorted signal paths.

The above-described embodiments of the present invention are merely meant to be illustrative and not limiting. It will thus be obvious to those skilled in the art that various changes and modifications may be made without departing from this invention in its broader aspects. For example, a thermal solder mask can also be used, and connections other than designed-in shorts can be removed using the present invention, such as lands. In addition, bond fingers are described, but any type of suitable electrical conductor can be used with the invention. Therefore, the appended claims encompass all such changes and modifications as fall within the true spirit and scope of this invention.

We claim:

1. A method for processing a substrate, comprising:
   providing a substrate having at least one conductive layer;
   forming a plurality of segments from the conductive layer, wherein a first plurality of the segments includes first portions for removal and second portions for plating;
   depositing a solder mask over the first portions;
   plating the second while the solder mask is overlying the first portions of the segments, and then removing at least portions of the solder mask overlying the first portions of the segments; and
   removing the first portions of the segments, wherein the removing of at least potions of the solder mask and the removing of the first portions of the segments is accomplished with a single laser use.

2. The method of claim 1, wherein the plating comprises nickel plating or gold plating.

3. The method of claim 1, wherein the segments comprise bond fingers and designed-in shorts.

4. The method of claim 1, wherein the segments comprise copper.

5. The method of claim 1, wherein said solder mask is a photoimageable solder mask.

6. The method of claim 1, wherein said solder mask is a thermal solder mask.

7. A method of processing a substrate, comprising:
   providing a multi-layer substrate having at least one conductive layer;
   patterning traces from the conductive layer;
   selecting a first portion from at least one of the traces, wherein the first portion is to be removed;
   depositing a laser-ablatable mask over the first portion;
   removing portions of the laser-ablatable mask overlying the first portion using a laser; and
   removing the first portion completely using said laser, wherein the removing of the portions of the laser-ablatable mask and the removing of the first portion is accomplished with a single laser use.

8. The method of claim 7, further comprising plating at least one of the traces left exposed by the solder mask.

9. The method of claim 8, wherein the plating comprises nickel or gold plating.

10. The method of claim 7, wherein the traces comprise bond fingers and designed-in shorts and the first portion is part of the designed-in shorts.

11. The method of claim 7, wherein said laser-ablatable mask is a photoimageable mask.

12. The method of claim 7, wherein said laser-ablatable mask is a thermal mask.

13. A method for manufacturing a substrate, comprising:

providing a substrate having at least one conductive layer;

patterning bond fingers and designed-in shorts from the conductive layer, wherein the designed-in shorts comprise portions for removal;

depositing a solder mask over the portions of the designed-in shorts;

plating the bond fingers while the portions of the designed-in shorts are covered by the solder mask;

removing the solder mask overlying the portions of the designed-in shorts; and removing the portions of the designed-in shorts, wherein the removing of the solder mask and the removing of the portions of the designed-in shorts is accomplished with a single laser use.

14. The method of claim 13, wherein said solder mask is a photoimageable solder mask.

15. The method of claim 13, wherein said solder mask is a thermal solder mask.

16. A method for processing a substrate, comprising:

providing a substrate having a plurality of metal traces, each said trace including a first portion and a second portion, wherein a thermal solder mask covers the first portion;

plating at least part of the second portion of the traces while using the solder mask to avoid plating the first portion, and then removing the solder mask from the first portion of the traces using a laser; and removing the first portion of the traces, wherein the removing of the thermal solder mask and the underlying first portion of the traces is through a single laser operation.

\* \* \* \* \*